(12) United States Patent
Choi et al.

(10) Patent No.: US 12,426,275 B2
(45) Date of Patent: Sep. 23, 2025

(54) SWITCHING DEVICE AND MEMORY DEVICE INCLUDING THE SAME

(71) Applicant: Samsung Electronics Co., Ltd., Suwon-si (KR)

(72) Inventors: Minwoo Choi, Hwaseong-si (KR); Bonwon Koo, Suwon-si (KR); Yongyoung Park, Hwaseong-si (KR); Hajun Sung, Hwaseong-si (KR); Dongho Ahn, Hwaseong-si (KR); Kiyeon Yang, Seoul (KR); Wooyoung Yang, Suwon-si (KR); Changseung Lee, Yongin-si (KR)

(73) Assignee: Samsung Electronics Co., Ltd., Gyeonggi-Do (KR)

(*) Notice: Subject to any disclaimer, the term of this patent is extended or adjusted under 35 U.S.C. 154(b) by 441 days.

(21) Appl. No.: 17/522,197

(22) Filed: Nov. 9, 2021

(65) Prior Publication Data
US 2023/0042262 A1  Feb. 9, 2023

(30) Foreign Application Priority Data

Aug. 4, 2021  (KR) .................. 10-2021-0102665

(51) Int. Cl.
*H10B 63/00* (2023.01)
*G11C 13/00* (2006.01)
*H10N 70/00* (2023.01)

(52) U.S. Cl.
CPC ......... *H10B 63/00* (2023.02); *G11C 13/0004* (2013.01); *H10N 70/021* (2023.02); *H10N 70/882* (2023.02)

(58) Field of Classification Search
CPC ........ H10B 63/00; H10B 63/24; H10B 63/80; H10B 63/84; H10B 63/20; H10B 61/00;
(Continued)

(56) References Cited

U.S. PATENT DOCUMENTS 7,638,789 B2  12/2009 Peters
7,864,567 B2   1/2011 Gordon et al.
(Continued)

FOREIGN PATENT DOCUMENTS

CN   112786783 A   5/2021
KR  10-2016-0003221 A   1/2016
(Continued)

OTHER PUBLICATIONS

Extended European Search Report dated Apr. 11, 2022 issued in corresponding European Patent Application No. 21207214.4-1212.
(Continued)

*Primary Examiner* — Fernando L Toledo
*Assistant Examiner* — Marshall Mu-Nuo Hatfield
(74) *Attorney, Agent, or Firm* — Harness, Dickey & Pierce, P.L.C.

(57) ABSTRACT

Provided are a switching device and a memory device including the switching device. The switching device includes first and second electrodes, and a switching material layer provided between the first and second electrodes and including a chalcogenide. The switching material layer includes a core portion and a shell portion covering a side surface of the core portion. The switching layer includes a material having an electrical resistance greater than an electrical resistance of the core portion, for example in at least one of the core portion or the shell portion.

29 Claims, 20 Drawing Sheets

(58) Field of Classification Search
CPC .............. G11C 13/0004; G11C 13/003; G11C 13/0007; G11C 11/1659; G11C 2213/76; H10N 70/021; H10N 70/882; H10N 70/011; H10N 70/826; H10N 50/10
See application file for complete search history.

(56) References Cited

U.S. PATENT DOCUMENTS

| | | | |
|---|---|---|---|
| 8,486,743 B2 | 7/2013 | Bresolin et al. | |
| 9,153,777 B2* | 10/2015 | Boniardi | H10N 70/826 |
| 9,379,321 B1 | 6/2016 | Chang et al. | |
| 9,666,798 B1 | 5/2017 | Lee | |
| 9,704,921 B2 | 7/2017 | Kim et al. | |
| 9,748,311 B2 | 8/2017 | Fantini et al. | |
| 10,062,840 B2 | 8/2018 | Sim et al. | |
| 10,084,017 B2 | 9/2018 | Ohba et al. | |
| 10,163,977 B1 | 12/2018 | Fantini et al. | |
| 10,186,552 B2 | 1/2019 | Choi et al. | |
| 10,249,680 B2 | 4/2019 | Apodaca et al. | |
| 10,374,009 B1 | 8/2019 | Cheng et al. | |
| 10,937,961 B2 | 3/2021 | Ok et al. | |
| 2007/0158698 A1 | 7/2007 | Dennison et al. | |
| 2012/0126195 A1* | 5/2012 | Ignatiev | H10N 70/245 257/E45.002 |
| 2015/0001457 A1* | 1/2015 | Krebs | H10N 70/068 257/4 |
| 2016/0013404 A1 | 1/2016 | Boniardi et al. | |
| 2016/0336378 A1 | 11/2016 | Ohba et al. | |
| 2017/0069829 A1* | 3/2017 | Morise | H10B 61/20 |
| 2017/0237000 A1 | 8/2017 | Terai et al. | |
| 2018/0138406 A1 | 5/2018 | Kim et al. | |
| 2019/0074436 A1* | 3/2019 | Ha | H10N 70/841 |
| 2019/0122098 A1* | 4/2019 | Choi | G06N 3/049 |
| 2019/0148456 A1 | 5/2019 | Wu et al. | |
| 2020/0058871 A1* | 2/2020 | Lee | H10N 70/20 |
| 2020/0075850 A1* | 3/2020 | Park | H10B 63/20 |
| 2020/0194667 A1 | 6/2020 | Park et al. | |
| 2020/0219933 A1* | 7/2020 | Cheng | H10N 70/841 |
| 2020/0287131 A1* | 9/2020 | Kim | G11C 13/0004 |
| 2020/0295083 A1 | 9/2020 | Cheng et al. | |
| 2020/0388650 A1 | 12/2020 | Nardi et al. | |
| 2021/0167285 A1 | 6/2021 | Horii et al. | |

FOREIGN PATENT DOCUMENTS

| | | |
|---|---|---|
| KR | 10-2017-0092070 A | 8/2017 |
| KR | 10-2020-0026343 A | 3/2020 |
| KR | 10-2020-0073716 A | 6/2020 |
| KR | 10-2021-0068796 A | 6/2021 |

OTHER PUBLICATIONS

Korean Office Action dated Jul. 29, 2025 issued in Korean Patent Application No. 10-2021-0102665.

* cited by examiner

SWITCHING DEVICE AND MEMORY DEVICE INCLUDING THE SAME

CROSS-REFERENCE TO RELATED APPLICATION

This application is based on and claims priority under 35 U.S.C. § 119 to Korean Patent Application No. 10-2021-0102665, filed on Aug. 4, 2021, in the Korean Intellectual Property Office, the disclosure of which is incorporated by reference herein in its entirety.

BACKGROUND

Some example embodiments relate to a switching device and/or a memory device including the switching device.

A recently developed memory cell uses a 2-terminal-based switching device that allows high integration and a simplified wiring. In particular, in a memory device such as phase change memory (PRAM), an ovonic threshold switch (OTS) device using a chalcogenide may be used as a selector device of a memory cell.

SUMMARY

Provided are a switching device and/or a memory device including the switching device.

Additional aspects will be set forth in part in the description which follows and, in part, will be apparent from the description, or may be learned by practice of example embodiments.

According to some example embodiments, a switching device includes first and second electrodes vertically apart from each other, and a switching material layer between the first and second electrodes. The switching material layer includes a core portion and a shell portion, the shell portion covering a side surface of the core portion and including a material having an electrical resistance greater than an electrical resistance of the core portion. The switching material includes a chalcogenide, for example in either or both of the core portion and the shell portion.

The switching material layer may include a chalcogen element and at least one of Ge, As, or Sb. The chalcogen element may include at least one of Se or Te.

The switching material layer may further include a dopant. The dopant may include at least one of In, Al, C, B, Sr, Ga, O, N, Si, Ga, or P.

The core portion and the shell portion may have different material compositions and/or may include different materials.

The shell portion may cover a lower surface of the core portion.

The shell portion may cover an upper surface of the core portion.

The switching material layer may further include an interface layer provided on an upper surface of the core portion and having a p-n junction with the core portion or having a Schottky junction with the core portion.

The core portion and the shell portion may include a plurality of core portions and a plurality of shell portions, respectively.

The core portion may include a material having an energy bandgap less than an energy bandgap of the shell portion.

The core portion may include a material having a trap concentration greater than a trap concentration of the shell portion.

A cross-sectional size of the core portion may be 50% or more of a cross-sectional size of the switching material layer.

According to some example embodiments, a method of manufacturing a switching device includes sequentially forming a first electrode and a material layer including a chalcogenide and a second electrode, forming a core portion between the first and second electrodes by patterning the material layer, and forming a shell portion to cover a side surface of the core portion, the shell portion including a chalcogenide.

The shell portion may include a material having an electrical resistance greater than an electrical resistance of the core portion.

Each of the core portion and the shell portion may include a chalcogen element and at least one of Ge, As, or Sb.

Each of the core portion and the shell portion may further include a dopant.

The shell portion may be formed by a plasma doping method using oxygen and/or nitrogen, or a thin film deposition method.

According to some example embodiments, a method of manufacturing a switching device includes forming a first electrode, forming a dielectric layer to cover the first electrode, after the forming a dielectric layer to cover the first electrode, forming a trench in the dielectric layer to expose an upper surface of the first electrode, forming a shell portion on an inner wall of the trench, the shell portion including a chalcogenide, forming a core portion inside the shell portion, the core portion including a chalcogenide, and forming a second electrode on an upper surface of the core portion.

The shell portion may include a material having an electrical resistance greater than an electrical resistance of the core portion.

Each of the core portion and the shell portion may include a chalcogen element and at least one of Ge, As, or Sb.

Each of the core portion and the shell portion may further include a dopant.

According to some example embodiments, a memory device includes a plurality of memory cells. Each of the memory cells includes first, second, and third electrodes vertically apart from one another, a switching material layer between the first and second electrodes and including a chalcogenide, and a memory material layer between the second and third electrodes. The switching material layer may include a core portion and a shell portion, the shell portion covering a side surface of the core portion and including a material having an electrical resistance greater than an electrical resistance of the core portion.

The switching material layer may include a chalcogen element and at least one of Ge, As, or Sb.

The switching material layer may further include a dopant.

The core portion and the shell portion may include different materials or have different material compositions.

The shell portion may further cover a lower surface of the core portion.

The shell portion may further cover an upper surface of the core portion.

The switching material layer may further include an interface layer provided on an upper surface of the core portion to form/having a p-n junction or a Schottky junction with the core portion.

The core portion and the shell portion may include a plurality of core portions and a plurality of shell portions, respectively.

The memory device may have a three-dimensional (3D) cross point array structure.

The memory device may include at least one of PRAM, RRAM, MRAM, or a memristor.

According to some example embodiments, a two-terminal device comprises a switching material layer between the two terminals. The switching material layer comprises a core portion and a shielding portion, the shielding portion coaxial with the core portion and comprising a material having an electrical resistance greater than an electrical resistance of the core portion, and at least one of the core portion and the shielding portion comprise a chalcogenide.

The shielding portion may surround a sidewall of the core portion.

A memory cell may include a memory material layer directly connected to one of the two terminals of the two-terminal device.

A third terminal may be connected to the memory material layer.

An electronic device may include the memory cell and another active and/or passive component.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
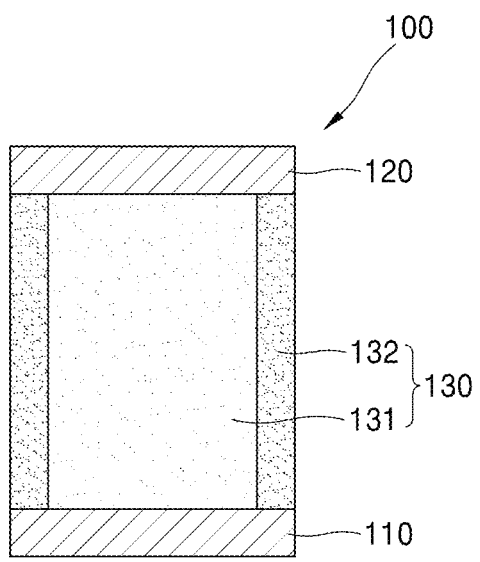
FIG. 1 is a cross-sectional view of a switching device according to some example embodiments.

Reference will now be made in detail to some embodiments, examples of which are illustrated in the accompanying drawings, wherein like reference numerals refer to like elements throughout. In this regard, example embodiments may have different forms and should not be construed as being limited to the descriptions set forth herein. Accordingly, example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Reference will now be made in detail to various example embodiments, examples of which are illustrated in the accompanying drawings. Throughout the drawings, like reference numerals refer to like elements. The thickness and/or size of each layer illustrated in the drawings may be exaggerated for convenience of explanation and clarity. In the description below, various embodiments are merely examples, and those of ordinary skill in the art to which example embodiments pertains could make various modifications and changes from these descriptions.

When a constituent element is disposed "above" or "on" to another constituent element, the constituent element may be only directly on the other constituent element or above the other constituent elements in a non-contact manner. An expression used in a singular form in the specification also includes the expression in its plural form unless clearly specified otherwise in context. When a part may "include" a certain constituent element, unless specified otherwise, it may not be construed to exclude another constituent element but may be construed to further include other constituent elements.

The use of the terms "a", "an", and "the" and similar referents in the context of describing the disclosure are to be construed to cover both the singular and the plural. In addition, the steps of all methods described herein can be performed in any suitable order unless otherwise indicated herein or otherwise clearly contradicted by context. The disclosure is not limited to the described order of the steps.

Furthermore, terms such as "~ portion," "~ unit," "~ module," and "~ block" stated in the specification may signify a unit to process at least one function or operation and the unit may be embodied by hardware, software, or a combination of hardware and software.

Furthermore, the connecting lines, or connectors shown in the various figures presented are intended to represent functional relationships and/or physical or logical couplings between the various elements. It should be noted that many alternative or additional functional relationships, physical connections or logical connections may be present in a practical device.

The use of any and all examples, or language (e.g., "such as") provided herein, is intended merely to better illuminate the disclosure and does not pose a limitation on the scope of the disclosure/inventive concepts unless otherwise claimed.

In memory devices having a three-dimensional (3D) cross point array structure such as a phase-change memory or phase-change RAM (PRAM), a resistive memory, and/or resistive RAM (RRAM), and the like, to prevent or reduce the likelihood of and/or impact from generation of a sneak current, a switching device that is a selector device is provided in each memory cell. Recently, ovonic threshold switching devices using chalcogenide-based materials are attracting attention as such switching devices. The ovonic threshold switching device exhibits a sharp decrease in resistance at a threshold voltage or more, and has an electrically reversible characteristic of returning to a high resistive state below a holding voltage. In the following description, the ovonic threshold switching device capable of reducing a leakage current as a switching device is described.

Figure 2:
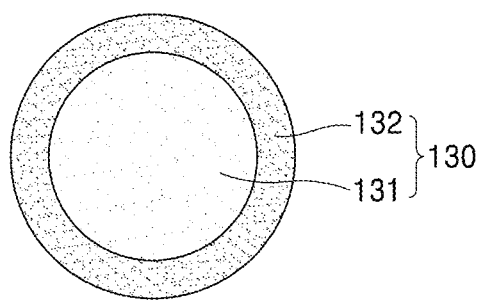
FIG. 2 is a plan view of a switching material layer of FIG. 1.

FIG. 1 is a cross-sectional view of a switching device 100 according to some example embodiments. FIG. 2 is a plan view of a switching material layer 130 of FIG. 1.

Referring to FIGS. 1 and 2, the switching device 100 may include first and second electrodes 110 and 120 and the switching material layer 130. The first and second electrodes 110 and 120 are vertically apart from each other, and the switching material layer 130 is provided between the first and second electrodes 110 and 120. FIGS. 1 and 2 illustrate an example case of the switching material layer 130 having a circular cross-section. However, example embodiments are not limited thereto, and the switching material layer 130 may have other shapes such as but not limited to a rectangular/square/elliptical/polygonal shapes.

The switching material layer 130 may have a core-shell structure to reduce a leakage current flowing in a sidewall of the switching material layer 130. In detail, the switching material layer 130 may include a core portion 131 and a shell portion 132 (or a cladding portion or a shield portion) provided to cover a side surface of the core portion 131. For example, the shell portion 132 may be coaxial with the core portion 131. As the shell portion 132 includes a material having an electrical resistance greater than an electrical resistance of the core portion 131, the flowing of a leakage current in the sidewall of the switching material layer 130 may be reduced. The cross-sectional size, for example, the diameter, of the core portion 131 may be 50% or more of the cross-sectional size of the switching material layer 130. However, this is merely an example, and embodiments are not limited thereto.

Each of the core portion 131 and the shell portion 132 may include a chalcogenide that is a compound of a chalcogen element. Each of the core portion 131 and the shell portion 132 may include, for example, a chalcogen element and at least one of Ge, As, or Sb. The chalcogen element may include at least one of Se or Te. Furthermore, each of the core portion 131 and the shell portion 132 may further include a dopant. The dopant may include, for example, at least one of In, Al, C, B, Sr, Ga, O, N, Si, Ga, or P. In some examples, each of the core portion 131 and the shell portion 132 may include a 4-component system compound including Ge, As, Se, and a dopant. However, this is merely an example.

The shell portion 132 may include a material having an electrical resistance greater than an electrical resistance of the core portion 131. To this end, the core portion 131 and the shell portion 132 may include different materials and/or may have different material compositions. The shell portion 132 may include a material having a higher energy bandgap than the core portion 131. Alternatively or additionally, the shell portion 132 may include a material having a lower trap concentration than the core portion 131. The trap concentration may mean or refer to or correspond to the density of a trap site in which electric charges are captured.

As such, as the shell portion 132 includes a material having an electrical resistance that is greater than an electrical resistance of the core portion 131, more or most current flows through the core portion 131, and accordingly, the flow of a leakage current in the sidewall of the switching material layer 130 may be restricted or reduced.

Although FIGS. 1 and 2 illustrate an example case of the switching material layer 130 having a circular cross-section, the switching material layer 130 may have various other cross-sectional shapes.

Figure 3:
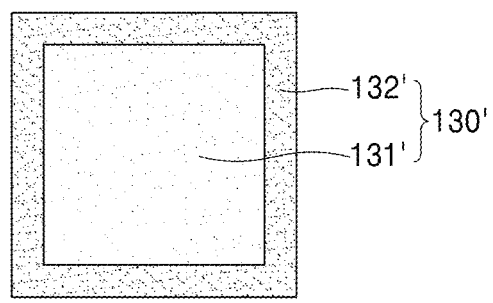
FIG. 3 is a cross-sectional view of a switching material layer that is applicable to the switching device of FIG. 1, according to some example embodiments.

FIG. 3 is a cross-sectional view of a switching material layer 130' that is applicable to the switching device 100 of FIG. 1, according to some example embodiments. Referring to FIG. 3, the switching material layer 130' may have a rectangular cross-section, for example a square cross-section. The switching material layer 130' may include a core portion 131' having a rectangular cross-section and a shell portion 132' provided to cover a side surface of the core portion 131'.

Figure 4:
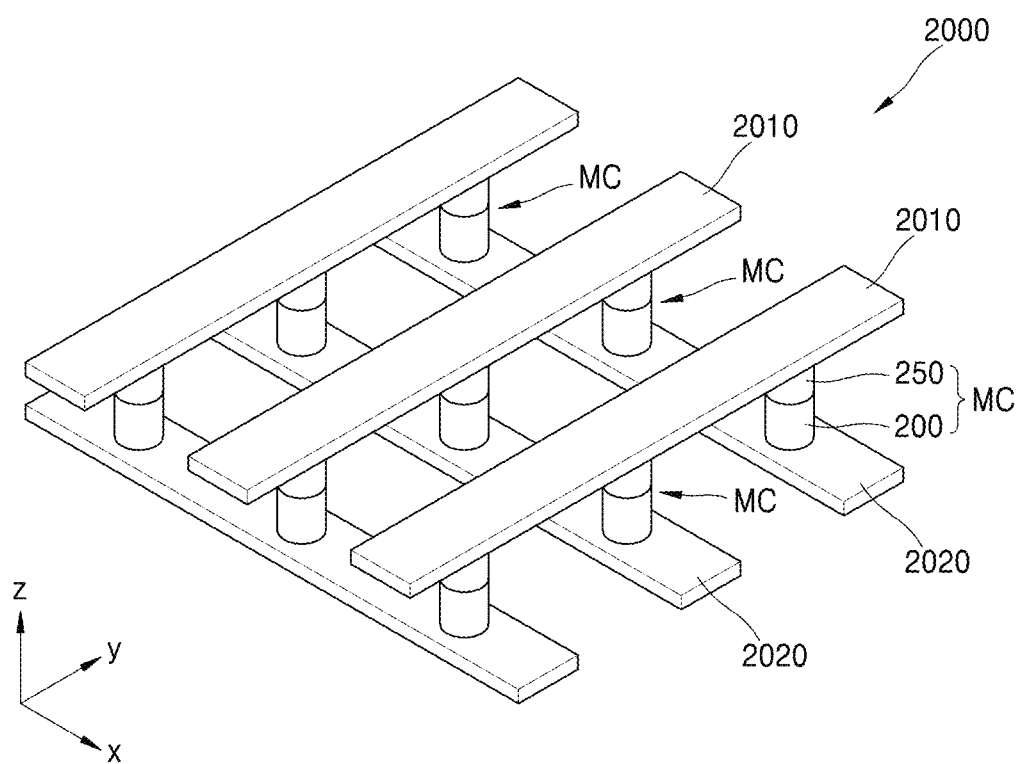
FIG. 4 is a cross-sectional view of a memory device according to some example embodiments.
Figure 5:
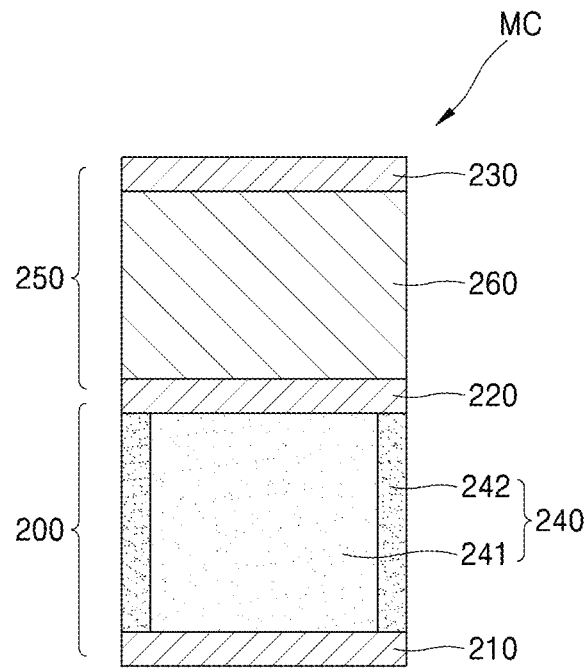
FIG. 5 is a cross-sectional view of a memory cell of FIG. 4.

FIG. 4 is a cross-sectional view of a memory device 2000 according to some example embodiments. FIG. 4 illustrates the memory device 2000 that adopts the switching device 100 of FIG. 1. FIG. 5 is a cross-sectional view of one of a plurality of memory cells MC of FIG. 4.

Referring to FIGS. 4 and 5, the memory device 2000 may include a plurality of memory cells MC and may have a three-dimensional cross point array structure. The memory device 2000 may include a phase-change memory (PRAM) and/or a resistive memory (RRAM). However, this is merely an example, in addition or as an alternative, and the memory device 2000 may include at last ne of a magnetic memory (MRAM), a memristor, and/or the like.

A plurality of bit lines 2020 (e.g. columns) extend in an X-axis direction below the memory cells MC, and a plurality of word lines 2010 (e.g. rows) extends in a Y-axis direction above the memory cells MC. The memory cells MC are provided at points where the bit lines 2020 cross the word lines 2010.

Each of the memory cells MC may include one switch element 200 and one memory element 250. Each of the memory cells MC may include first, second, and third electrodes 210, 220, and 230 vertically apart from one another, a switching material layer 240 provided between the first and second electrodes 210 and 220, and a memory material layer 260 provided between the second electrode 220 and the third electrode 230. The first electrode 210, the switching material layer 240, and the second electrode 220 constitute or correspond to or are included in the switch element 200. The the second electrode 220, the memory material layer 260, and the third electrode 230 constitute or correspond to or are included in the memory element 250. The second electrode 220 may serve as a common electrode of the switch element 200 and the memory element 250.

The switch element 200, as an ovonic threshold switching device, may be the same as the switching device 100 of FIG. 1. The switching material layer 240 may have a core-shell structure including a core portion 241 and a shell portion 242 provided to cover a side surface of the core portion 241. As the shell portion 242 includes a material a material having an electrical resistance greater than an electrical resistance of the core portion 241, the flow of a leakage current in a sidewall of the switching material layer 240 may be restricted or reduced.

Each of the core portion 241 and the shell portion 242 may include a chalcogenide that is a compound of a chalcogen element. The core portion 241 and the shell portion 242 may include different materials and/or may have compositions of different materials. Each of the core portion 241 and the shell portion 242 may include, for example, a chalcogen element and at least one of Ge, As, or Sb. The chalcogen element may include at least one of Se or Te. Furthermore, either or both of the core portion 241 and the shell portion 242 may further include a dopant such as the same or different dopants. The dopant may include, for example, at least one of In, Al, C, B, Sr, Ga, O, N, Si, Ga, or P. In a detailed example, each of the core portion 241 and the shell portion 242 may include a 4-component system compound including Ge, As, Se and a dopant.

The memory element 250 may include the second and third electrodes 220 and 230 and the memory material layer 260 provided between the second and third electrodes 220 and 230. When the memory device 2000 is, for example, PRAM, the memory material layer 260 may be or included a phase-change material layer. The phase-change material layer may include, for example, a chalcogenide-based material. In a detailed example, the phase-change material layer may include Ge, Sb, and Te (e.g., GST). Furthermore, when the memory device 2000 is, for example, RRAM, the memory material layer 260 may be or may include a resistance material layer.

In the memory device 2000, as the memory cells MC share the word lines 2010 and the bit lines 2020, a leakage current of the switch element 200 provided in each of the memory cells MC may adversely affect the three-dimensional cross point array structure. Accordingly, in some example embodiments, as the switch element 200 has a core-shell structure and the shell portion 242 has a greater electrical resistance than the core portion 241, the flow of a leakage current in the sidewall of the switch element 200 may be reduced.

Figure 6:
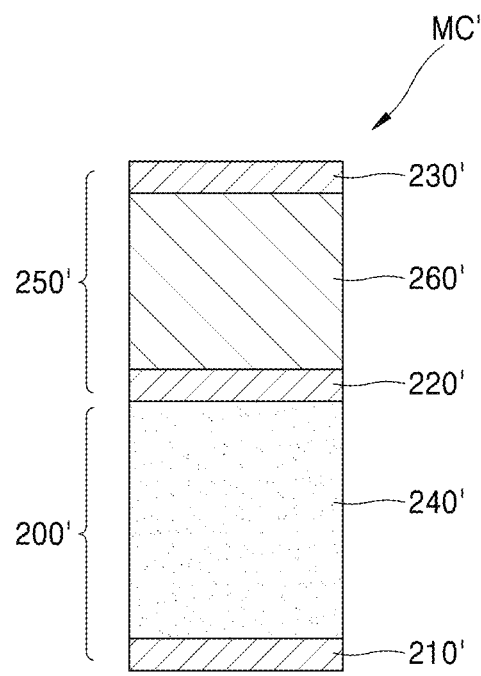
FIG. 6 is a cross-sectional view of a general memory cell.

FIG. 6 is a cross-sectional view of a general memory cell MC' applied to a memory device having a three-dimensional cross point array structure, according to the related art. Referring to FIG. 6, the memory cell MC' may include first, second, and third electrode 210', 220', and 230' apart from one another, a switching material layer 240' provided between the first electrode 210' and the second electrode 220', and a memory material layer 260' provided between the second electrode 220' and the third electrode 230'. The first electrode 210', the switching material layer 240', and the second electrode 220' constitute or correspond to or be included in a switch element 200'. The second electrode 220', the memory material layer 260', and the third electrode 230' constitute or correspond to or be included in a memory element 250'. The switching material layer 240' is a single material layer and include a chalcogenide-based material.

Figure 7:
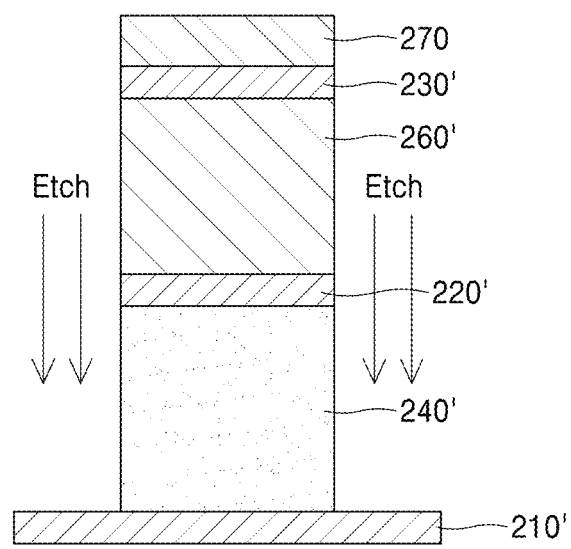
FIG. 7 is a cross-sectional view showing a method of manufacturing the memory cell of FIG. 6.

FIG. 7 is a cross-sectional view showing a method of manufacturing the memory cell MC' of FIG. 6. Referring to FIG. 7, each of the first electrode 210', the switching material layer 240', the second electrode 220', the memory material layer 260', and the third electrode 230' are sequentially deposited, and the deposited layers are integrally etched (e.g. etched within one process chamber) by using an etching mask 270 to form the memory cell MC' having a pillar structure. The switch element 200' requires or uses a strong electric field for threshold switching generation. For low voltage driving, the memory cell MC' may have a very small cross-sectional size of a level of, for example, several tens of nanometers. As such, as the cross-sectional size of the memory cell MC' is limited, the effect generated in the sidewall of the switching material layer 240' may greatly affect the performance of the switch element 200'.

In a memory device according to related art, as each memory cell MC' is formed in an integral etching process, the sidewall of the switching material layer 240' may be weakened (e.g. weakened with plasma damage), and accordingly, a leakage current flowing in the sidewall of the switch element 200' may increase. In detail, a defect may be generated in the sidewall of the switching material layer 240' due to the integral etching process, such a defect may act as a trap site. Generally, in a fundamental conduction mechanism of an ovonic switching device, electric charges may move in a lower current region through the trap site. Accordingly, the trap site generated in the sidewall of the switching material layer 240' may form a leakage path, thereby increasing in an off current.

Furthermore, due to the integral etching process, a composition change may be generated in the sidewall of the switching material layer 240', and thus a leakage current may be increased. For example, as selenium (Se) loss may occur in the sidewall of the switching material layer 240' including 4-component system compound including Ge, As, Se and a dopant due to the integral etching process, the properties of the switching material layer 240' may be changed, and accordingly, the leakage path may be increased in the sidewall of the switch element 200'.

As the leakage current flowing in the sidewall of the switching material layer 240' increases, cross-talk may be generated between the neighboring memory cells MC'. In addition, as a sneak current is caused by the leakage current, a selection function of the memory cell MC' may be problematic. Accordingly, the low off current characteristic may be difficult to secure, and thus low power device driving is impossible or difficult.

According to some example embodiments, in the memory device 2000, as the switch element 200, in detail, the switching material layer 240, has a core-shell structure and the shell portion 242 has a greater electrical resistance than the core portion 241, most or more current may flow through the core portion 241, and the leakage current flowing in the sidewall of the switch element 200 may be reduced. Accordingly, the memory device 2000 capable of low or lower power driving may be implemented by securing the low off current characteristic.

Figure 8:
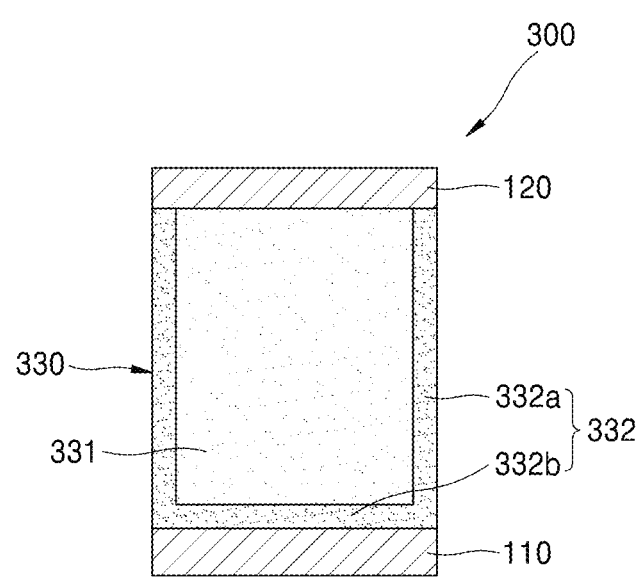
FIG. 8 is a cross-sectional view of a switching device according to some example embodiments.

In the following description, various switching devices applicable to the memory device 2000 having the above-described three-dimensional cross point array structure are described. FIG. 8 is a cross-sectional view of a switching device 300 according to some example embodiments. In the following description, differences from example embodiments are mainly described.

Referring to FIG. 8, a switching material layer 330 may include a core portion 331 and a shell portion 332. The shell portion 332 may include a first shell portion 332a provided to cover/surround a side surface of the core portion 331, and a second shell portion 332b provided to cover a lower surface of the core portion 331. A thickness of the first portion 332a may be the same as, greater than, or less than a thickness of the second portion 332b.

Each of the core portion 331 and the first and second shell portions 332a and 332b may include a chalcogenide. Each of the core portion 331 and the first and second shell portions 332a and 332b may include, for example, a chalcogen element and at least one of Ge, As, or Sb. The chalcogen element may include at least one of Se or Te. Furthermore, each of or at least one of the core portion 331 and the first and second shell portions 332a and 332b may further include a dopant. The dopant may include, for example, at least one of In, Al, C, B, Sr, Ga, O, N, Si, Ga, or P.

Each of the first and second shell portions 332a and 332 may include a material having an electrical resistance greater than an electrical resistance of the core portion 331. Each of the first and second shell portions 332a and 332b may include a material having a higher energy bandgap than the core portion 331. Alternatively or additionally, each of the first and second shell portions 332a and 332b may include a material having a lower trap concentration than the core portion 331.

Each of the first and second shell portions 332a and 332b may include a different material from the core portion 331, and/or may have a different material composition from the core portion 331. The first shell portion 332a and the second shell portion 332b constituting the shell portion 332 may include the same material and have the same material composition. However, example embodiments are not necessarily limited thereto.

As the first shell portion 332a is provided to cover the side surface of the core portion 331, a leakage current flowing in the sidewall of the switching material layer 330 may be reduced. Furthermore, as the second shell portion 332b is provided to cover the lower surface of the core portion 331, a leakage current flowing in the upper surface of the switching material layer 330 in contact with the first electrode 110 may be reduced.

In some example embodiments, as the first and second shell portions 332a and 332b including a material having an electrical resistance greater than an electrical resistance of the core portion 331 are respectively provided at the side surface and lower surface of the core portion 331, a leakage current flowing in the switching device 300 may be reduced.

Figure 9:
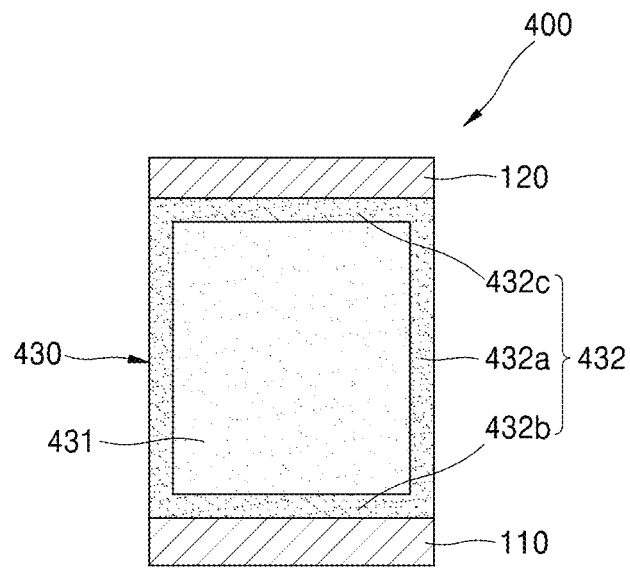
FIG. 9 is a cross-sectional view of a switching device according to some example embodiments.

FIG. 9 is a cross-sectional view of a switching device 400 according to some example embodiments.

Referring to FIG. 9, a switching material layer 430 may include a core portion 431 and a shell portion 432. The shell portion 432 may include a first shell portion 432a provided to cover a side surface of the core portion 431, a second shell portion 432b provided to cover a lower surface of the core portion 431, and a third shell portion 432c provided to cover an upper surface of the core portion 431. Thicknesses of each of or any of the shell portions 432a, 432b, and 432c may be the same, or different, from each other.

Each of the first, second, and third shell portions 432a, 432b, and 432c may include a material having an electrical resistance greater than an electrical resistance of the core portion 431. As the first shell portion 432a is provided to cover the side surface of the core portion 431, a leakage current flowing in the sidewall of the switching material layer 430 may be reduced. As the second shell portion 432b is provided to cover the lower surface of the core portion 431, a leakage current flowing in the lower surface of the switching material layer 430 in contact with the first electrode 110 may be reduced. As the third shell portion 432c is provided to cover the upper surface of the core portion 431, a leakage current flowing in the upper surface of the switching material layer 430 in contact with the second electrode 120 may be reduced.

As such, in some example embodiments, as the first, second, and third shell portions 432a, 432b, and 432c including a material having an electrical resistance greater than an electrical resistance of the core portion 431 are respectively provided at the side surface, lower surface, and upper surface of the core portion 431, a leakage current flowing in the switching device 400 may be reduced.

Figure 10:
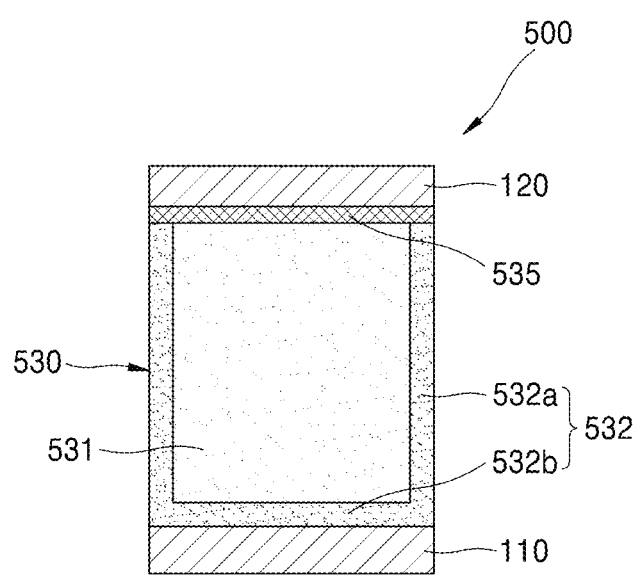
FIG. 10 is a cross-sectional view of a switching device according to some example embodiments.

FIG. 10 is a cross-sectional view of a switching device 500 according to some example embodiments.

Referring to FIG. 10, a switching material layer 530 may include a core portion 531, a shell portion 532, and an interface layer 535. The shell portion 532 may include a first shell portion 532a provided to cove/surround a side surface of the core portion 531 and a second shell portion 532b provided to cover a lower surface of the core portion 531. The interface layer 535 is provided to cover an upper surface of the core portion 531.

Each of the first and second shell portions 532a and 532b may include a material having an electrical resistance greater than an electrical resistance of the core portion 531. As the first shell portion 532a is provided to cover the side surface of the core portion 531, a leakage current flowing in a sidewall of the switching material layer 530 may be reduced. Furthermore, as the second shell portion 532b is provided to cover the lower surface of the core portion 531, a leakage current flowing in a lower surface of the switching material layer 530 in contact with the first electrode 110 may be reduced.

The interface layer 535 may be provided on the upper surface of the core portion 531 to form or to have a p-n junction or a Schottky junction with the core portion 531. The interface layer 535 may be formed by doping the upper surface of the core portion 531 with a certain dopant. As such, as the interface layer 535 forming a p-n junction or a Schottky junction is provided on the upper surface of the core portion 531, a junction barrier may be formed between the second electrode 120 and the switching material layer 530. Accordingly, a leakage current flowing in the upper surface of the switching material layer 530 in contact with the second electrode 120 may be reduced.

Figure 11:
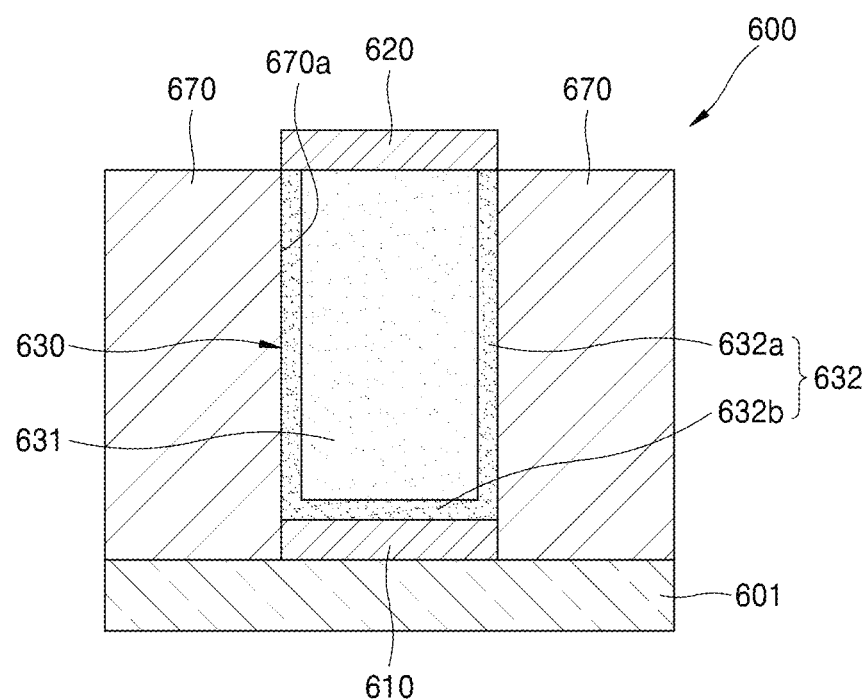
FIG. 11 is a cross-sectional view of a switching device according to some example embodiments.

FIG. 11 is a cross-sectional view of a switching device 600 according to some example embodiments.

Referring to FIG. 11, a dielectric layer 670 is provided on a substrate 601, and a trench 670a is formed in the dielectric layer 670. FIG. 11 illustrates an example case in which the trench 670a is formed to a depth to expose an upper surface of the substrate 601. The trench 670a may have, for example, a circular cross-section or rectangular cross-section, but example embodiments are not limited thereto.

A first electrode 610 is provided on a bottom of the trench 670a, and a switching material layer 630 is provided on an upper surface of the first electrode 610. The switching material layer 630 is provided to fill the inside of the trench 670a. The switching material layer 630 may include a core portion 631 and a shell portion 632 provided on an outer surface of the core portion 631. The shell portion 632 is provided on an inner wall of the trench 670a to surround the core portion 631. The shell portion 632 may include a first shell portion 632a provided to cover a side surface of the core portion 631 and a second shell portion 632b provided to cover a lower surface of the core portion 631. A second electrode 620 is provided an upper surface of the switching material layer 630.

Each of the core portion 631 and the first and second shell portions 632a and 632b constituting or included in or corresponding to the switching material layer 630 may include a chalcogenide. Each of the core portion 631 and the first and second shell portions 632a and 632b may include, for example, a chalcogen element and at least one of Ge, As, or Sb. The chalcogen element may include at least one of Se or Te. Furthermore, each of the core portion 631 and the first and second shell portions 632a and 632b may further include a dopant. The dopant may include, for example, at least one of In, Al, C, B, Sr, Ga, O, N, Si, Ga, or P.

Each of the first and second shell portions 632a and 632b may include a material having an electrical resistance greater than an electrical resistance of the core portion 631. Each of the first and second shell portions 632a and 632b may include a material having a higher energy bandgap than the core portion 631. Furthermore, each of the first and second shell portions 632a and 632b may include a material having a lower trap concentration than the core portion 631. Each of the first and second shell portions 632a and 632b may include a different material from the core portion 631 or may have a different material composition from the core portion 631.

As the first shell portion 632a is provided to cover the side surface of the core portion 631, a leakage current flowing in a sidewall of the switching material layer 630 may be reduced. Furthermore, as the second shell portion 632b is provided to cover the lower surface of the core portion 631, a leakage current flowing in the lower surface of the switching material layer 630 in contact with the first electrode 610 may be reduced.

Figure 12:
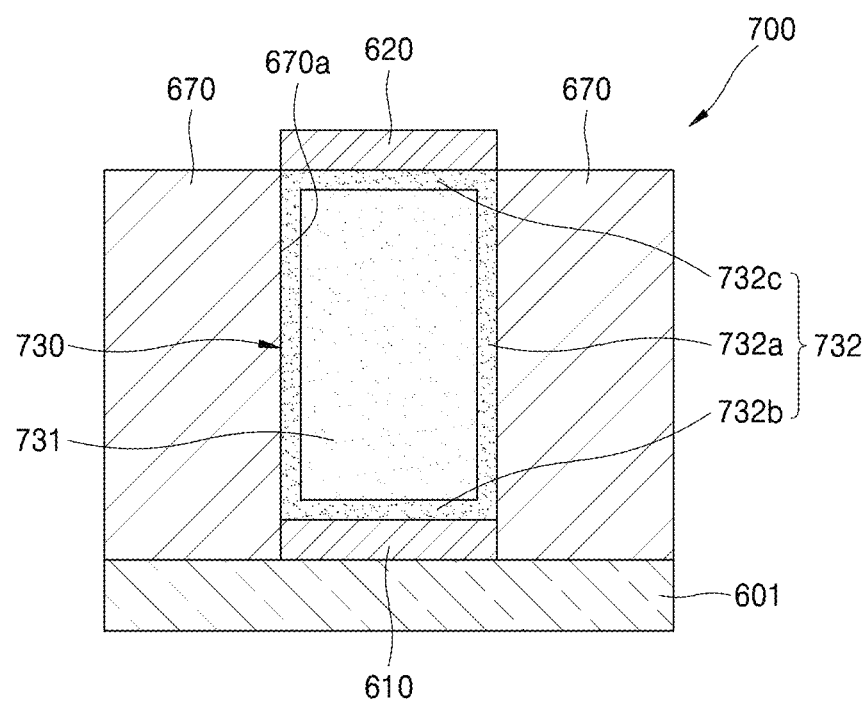
FIG. 12 is a cross-sectional view of a switching device according to some example embodiments.

FIG. 12 is a cross-sectional view of a switching device 700 according to some example embodiments. In the following description differences from the above-described embodiment are mainly described.

Referring to FIG. 12, a switching material layer 730 is provided in the trench 670a formed in the dielectric layer 670. The switching material layer 730 may include a core portion 731 and a shell portion 732 provided on an outer surface of the core portion 731. The shell portion 732 is provided on the inner wall of the trench 670a to surround the core portion 731. The shell portion 732 may include a first shell portion 732a provided to cover a side surface of the core portion 731, a second shell portion 732b provided to cover a lower surface of the core portion 731, and a third shell portion 732c provided to cover an upper surface of the core portion 731.

Each of the first, second, and third shell portions 732a, 732b, and 732c may include a material having an electrical resistance greater than an electrical resistance of the core portion 731. As the first shell portion 732a is provided to cover the side surface of the core portion 731, a leakage current flowing in a sidewall of the switching material layer 730 may be reduced. As the second shell portion 732b is provided to cover the lower surface of the core portion 731, a leakage current flowing in the lower surface of the switching material layer 730 in contact with the first electrode 610 may be reduced. As the third shell portion 732c provided to cover the upper surface of the core portion 731, a leakage current flowing in the upper surface of the switching material layer 730 in contact with the second electrode 620 may be reduced.

Figure 13:
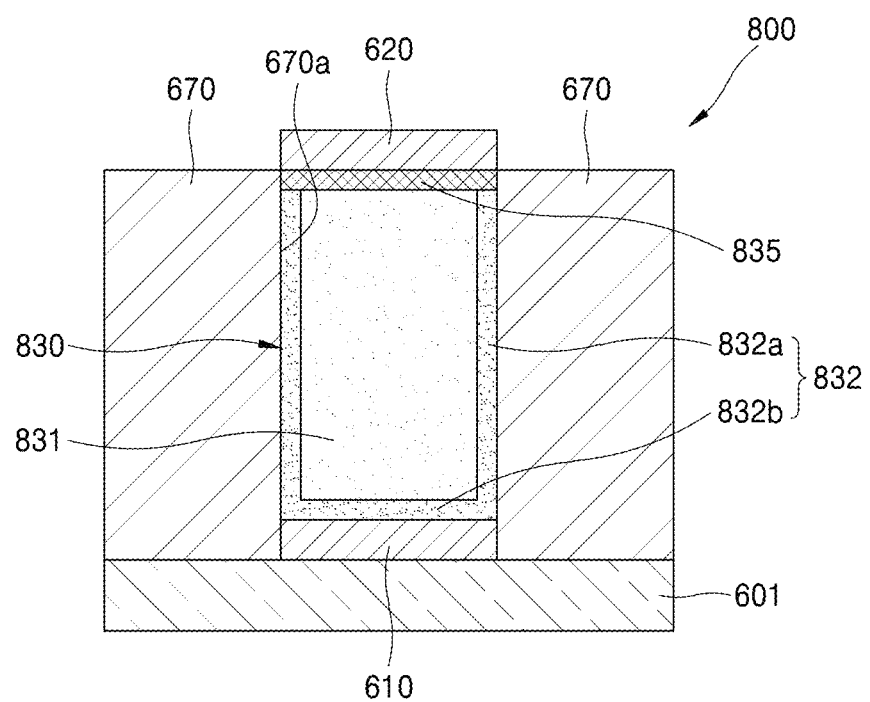
FIG. 13 is a cross-sectional view of a switching device according to some example embodiments.

FIG. 13 is a cross-sectional view of a switching device 800 according to some example embodiments.

Referring to FIG. 13, a switching material layer 830 is provided in the inside of the trench 670a formed in the dielectric layer 670. The switching material layer 830 may include a core portion 831, a shell portion 832, and an interface layer 835. The shell portion 832 may include a first shell portion 832a provided to cover a side surface of the core portion 831 and a second shell portion 832b provided to cover a lower surface of the core portion 831. The interface layer 835 may be provided to cover an upper surface of the core portion 831.

Each of the first and second shell portions 832a and 832b may include a material having an electrical resistance greater than an electrical resistance of the core portion 831. As the first shell portion 832a is provided to cover the side surface of the core portion 831, a leakage current flowing in a sidewall of the switching material layer 830 may be reduced. As the second shell portion 832b is provided to cover the lower surface of the core portion 831, a leakage current flowing in a lower surface of the switching material layer 830 may be reduced.

The interface layer 835 may be provided on the upper surface of the core portion 831 to form a p-n junction or a Schottky junction with the core portion 831. As a junction barrier is formed by the interface layer 835 between the second electrode 620 and the switching material layer 830, a leakage current flowing in an upper surface of the switching material layer 830 may be reduced.

Figure 14:
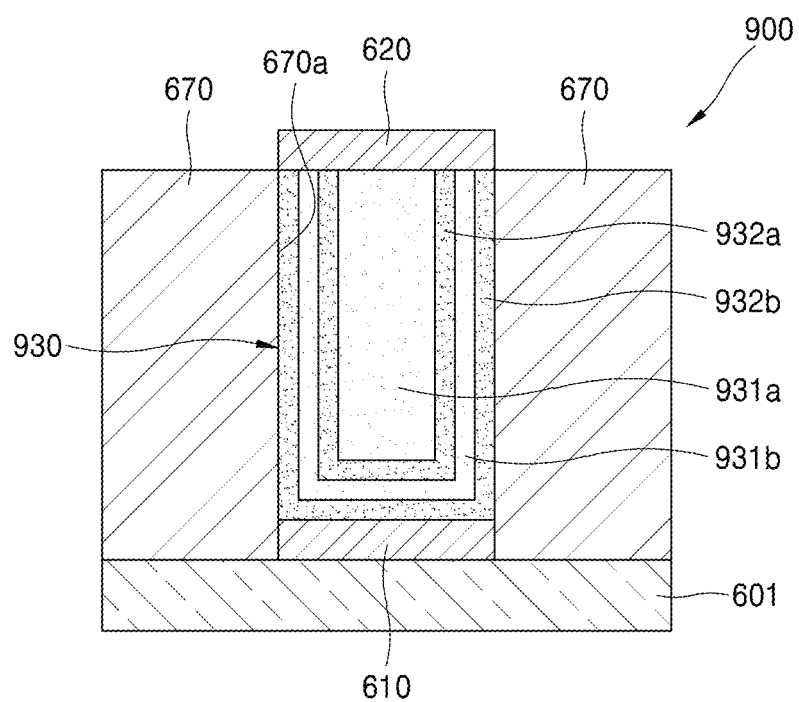
FIG. 14 is a cross-sectional view of a switching device according to some example embodiments.

FIG. 14 is a cross-sectional view of a switching device 900 according to some example embodiments.

Referring to FIG. 14, a switching material layer 930 is provided in the inside of the trench 670a. The switching material layer 930 may include a plurality of core portions and a plurality of shell portions. FIG. 14 illustrates an example case in which the core portions include first and second core portions 931a and 931b and the shell portions include first and second shell portions 932a and 932b. However, example embodiments are not limited thereto.

The core portions and the shell portions are alternately arranged. In detail, the first shell portion 932a may be provided to cover a side surface and a lower surface of the first core portion 931a. The second core portion 931b may be provided to cover a side surface and a lower surface of the first shell portion 932a, and the second shell portion 932b may be provided to cover a side surface and a lower surface of the second core portion 931b.

Each of the first and second shell portions 932a and 932b may include a material having an electrical resistance greater than electrical resistances of the first and second core portions 931a and 931b. As such, as the switching material layer 930 includes the core portions and the shell portions, a leakage current flowing in the switching material layer 930 may be reduced.

Figure 15:
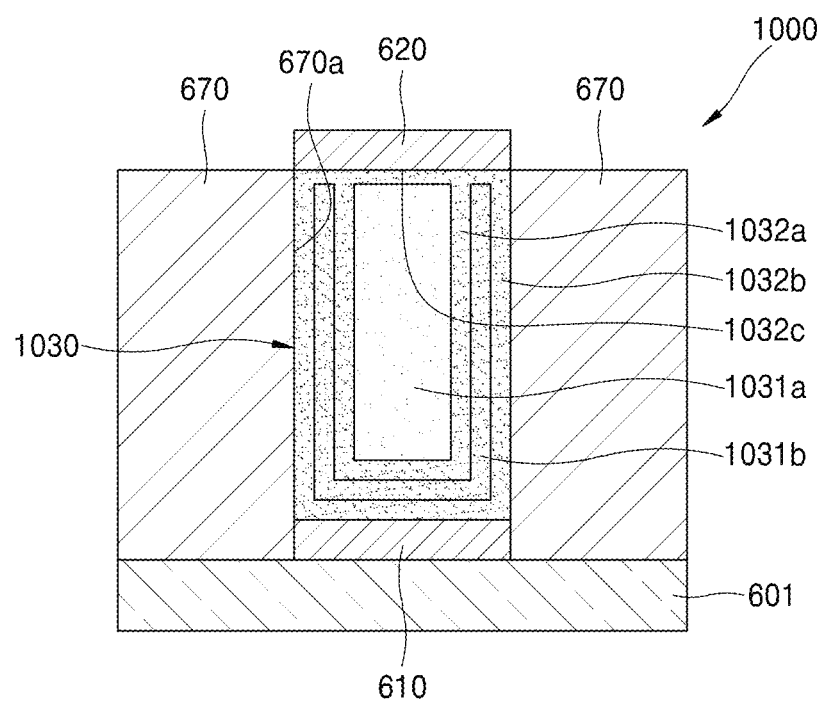
FIG. 15 is a cross-sectional view of a switching device according to some example embodiments.

FIG. 15 is a cross-sectional view of a switching device 1000 according to some example embodiments.

Referring to FIG. 15, a switching material layer 1030 is provided in the inside of the trench 670a. The switching material layer 1030 may include a plurality of core portions and a plurality of shell portions. FIG. 15 illustrates an example case in which the core portions include first and second core portions 1031a and 1031b and the shell portions include first, second, and third shell portions 1032a, 1032b, and 1032c. However, example embodiments are not limited thereto.

The first shell portion 1032a may be provided to cover a side surface and a lower surface of the first core portion 1031a. The second core portion 1031b may be provided to cover a side surface and a lower surface of the first shell portion 1032a, and the second shell portion 1032b may be provided to cover a side surface and a lower surface of the second core portion 1031b. The third shell portion 1032c may be provided to cover upper surfaces of the first and second core portions 1031a and 1031b. Each of the first, second, and third shell portions 1032a, 1032b, and 1032c may include a material having an electrical resistance greater than electrical resistances of the first and second core portions 1031a and 1031b.

Figure 16:
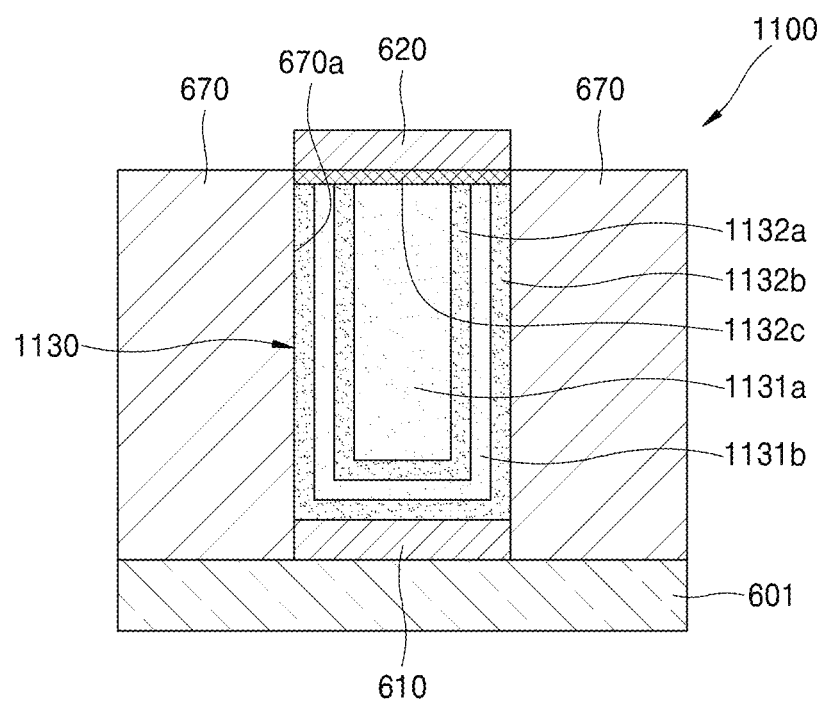
FIG. 16 is a cross-sectional view of a switching device according to some example embodiments.

FIG. 16 is a cross-sectional view of a switching device 1100 according to some example embodiments.

Referring to FIG. 16, a switching material layer 1130 is provided in the inside of the trench 670a. The switching material layer 1130 may include a plurality of core portions, a plurality of shell portions, and an interface layer 1135. The core portion may include first and second core portions 1131*a* and 1131*b*, and the shell portions may include the first and second shell portions 1132*a* and 1132*b*. The interface layer 1135 may be provided on upper surface of the first and second core portions 1131*a* and 1131*b*.

Each of the first and second shell portions 1132*a* and 1132*b* may include a material having an electrical resistance greater than electrical resistances of the first and second core portions 1131*a* and 1131*b*. The interface layer 1135 may be provided to form a p-n junction or a Schottky junction with the first and second core portions 1131*a* and 1131*b*.

Figure 17:
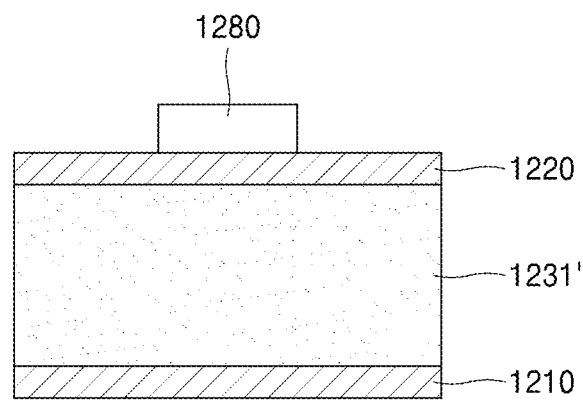
FIGS. 17 to 19 are cross-sectional views showing a method of manufacturing a switching device, according to some example embodiments.
Figure 18:
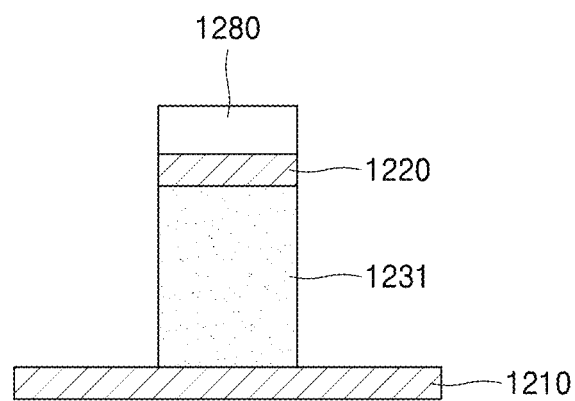
Figure 19:
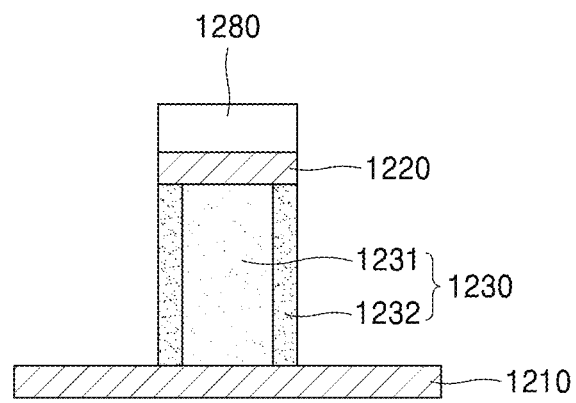

FIGS. 17 to 19 are cross-sectional views showing a method of manufacturing a switching device, according to some example embodiments. FIGS. 17 to 19 illustrate a method of manufacturing the switching device 100 of FIG. 1.

Referring to FIG. 17, a core layer 1231' and a second electrode 1220 are sequentially deposited on a first electrode 1210, and then an etching mask 1280 is provided on an upper surface of the second electrode 1220. The core layer 1231' may include a chalcogenide. The core layer 1231' may include, for example, a chalcogen element and at least one of Ge, As, or Sb. The chalcogen element may include at least one of Se or Te. Furthermore, the core layer 1231' may further include a dopant. The dopant may include, for example, at least one of In, Al, C, B, Sr, Ga, O, N, Si, Ga, or P. In a detailed example, the core layer 1231' may include a 4-component system compound including Ge, As, Se and a dopant.

Referring to FIG. 18, by etching (e.g. dry etching with a plasma etch process) the second electrode 1220 and the core layer 1231' using the etching mask 1280, a core portion 1231 is formed between first and second electrodes 1210 and 1220. Referring to FIG. 19, a shell portion 1232 is formed/deposited/grown on a side surface of the core portion 1231. Accordingly, a switching material layer 1230 having a core-shell structure is formed. The shell portion 1232 may include a chalcogenide-based material like a core portion. The shell portion 1232 may include a material having an electrical resistance greater than an electrical resistance of the core portion 1231. The shell portion 1232 may include a different material from the core portion 1231 or may have a different material composition from the core portion 1231.

The shell portion 1232 may be formed on a side surface of the core portion by, for example, plasma doping using oxygen and/or nitrogen. In this case, as the shell portion 1232 includes oxygen and/or nitrogen, the shell portion 1232 may have an electrical resistance greater than an electrical resistance of the core portion 1231. Furthermore, the shell portion 1232 may be formed on the side surface of the core portion 1231 through, for example, surface reaction. For example, as a surface reaction such as selenization process is performed on the side surface of the core portion 1231, the shell portion 1232 having a greater Se content than the core portion 1231 may be formed. Accordingly, the shell portion 1232 may have an electrical resistance greater than an electrical resistance of the core portion 1231. The shell portion 1232 may be formed by a thin film deposition method such as at least one of chemical vapor deposition (CVD) such as a plasma-enhanced chemical vapor deposition process, a physical vapor deposition (PVD), and the like. Alternatively or additionally, the shell portion 1232 may be may be grown around or conformally around the core portion 1231, for example with a low pressure chemical vapor deposition process. Then, by removing the etching mask 1280 remaining on the second electrode 1220, a switching device may be completed.

Although in the above description a case in which the shell portion 1232 covers the side surface of the core portion 1231 is described, the shell portion 1232 may be formed to cover a lower surface and/or an upper surface of the core portion 1231. Furthermore, an interface layer (not shown) forming a junction barrier with the core portion 1231 may be additionally formed on the upper surface of the core portion 1231.

FIGS. 20 to 24 are cross-sectional views showing a method of manufacturing a memory cell, according to some example embodiments. FIGS. 20 to 24 illustrate a method of manufacturing the memory cells MC of FIG. 5.

Figure 20:
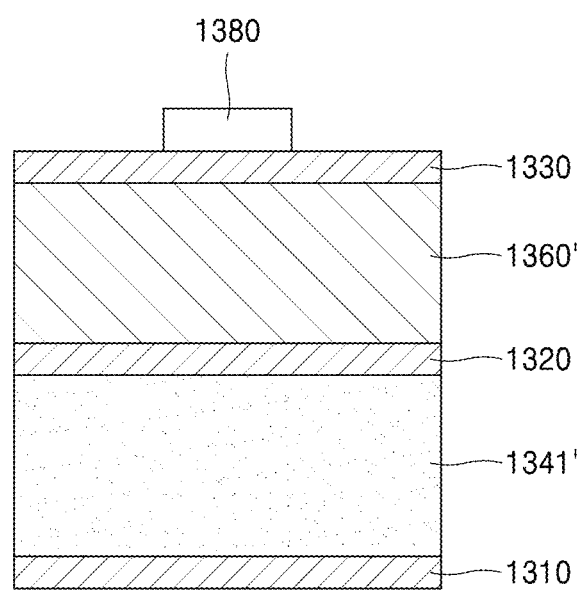
FIGS. 20 to 24 are cross-sectional views showing a method of manufacturing a memory cell, according to some example embodiments.

Referring to FIG. 20, a first electrode 1310, a core layer 1341', a second electrode 1320, a memory layer 1360', and a third electrode 1330 are sequentially deposited, and then an etching mask 1380 is provided on an upper surface of the third electrode 1330. The core layer 1341' may include a chalcogenide-based material. The memory layer 1360' may include a phase-change material, a resistance material, a magnetic material, and the like, according to the type of a memory device.

Figure 21:
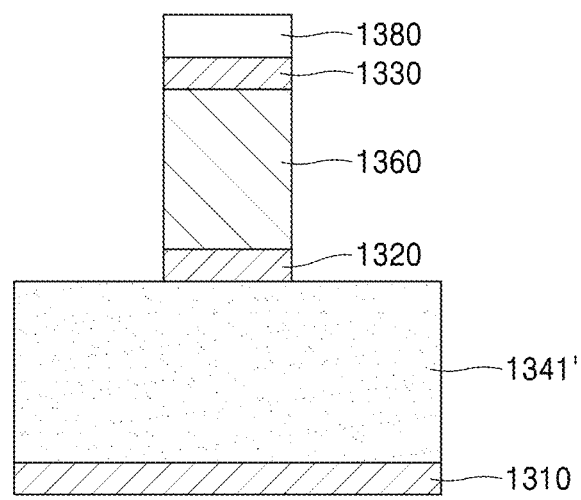

Referring to FIG. 21, the third electrode 1330, the memory layer 1360', and the second electrode 1320 are etched by using the etching mask 1380. Accordingly, a memory element including the second electrode 1320, a memory material layer 1360, and the third electrode 1330 is formed.

Figure 22:
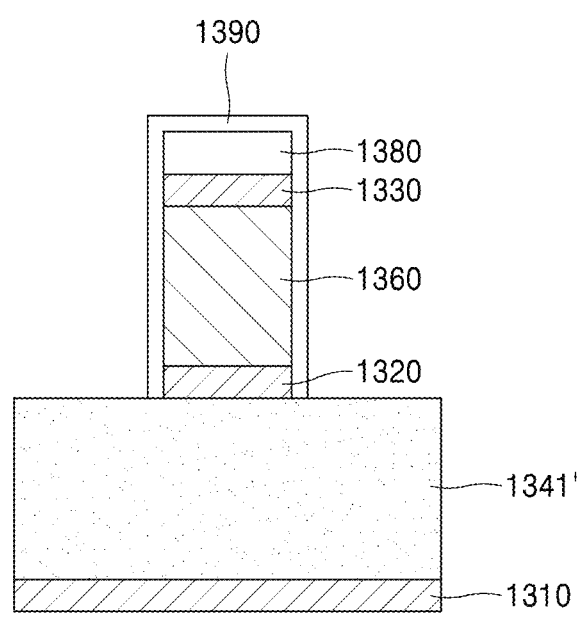
Figure 23:
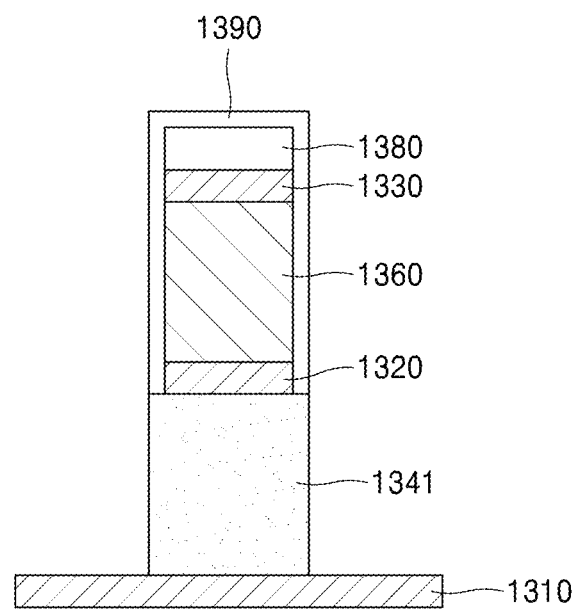

Referring to FIG. 22, a protection layer 1390 is formed to cover the second electrode 1320, the memory material layer 1360, the third electrode 1330, and the etching mask 1380, which are provided on the core layer 1341'. Referring to FIG. 23, a core portion 1341 is formed by etching the core layer 1341' by using the protection layer 1390.

Figure 24:
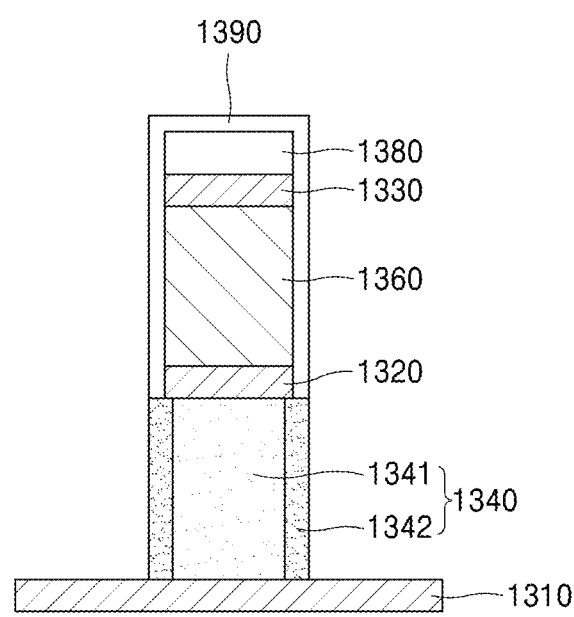

Referring to FIG. 24, a switching material layer 1340 having core-shell structure is formed by forming a shell portion 1342 on a side surface of the core portion 1341. Accordingly, a switch element including the first electrode 1310, the switching material layer 1340, and the second electrode 1320 is formed. The shell portion 1342 may include a chalcogenide-based material like the core portion 1341. The shell portion 1342 may include a material having an electrical resistance greater than an electrical resistance of the core portion 1341. The shell portion 1342 may include a different material from the core portion 1341 or may have a different material composition from the core portion 1341. The shell portion 1342 may be formed by, for example, plasma doping using oxygen or nitrogen, surface reaction, or a thin film deposition method. Then, a memory cell is completed by removing the etching mask 1380 and the protection layer 1390.

FIGS. 25 to 28 are cross-sectional views of a method of manufacturing a switching device, according to some example embodiments. FIGS. 25 to 28 illustrate a method of manufacturing the switching device 600 of FIG. 11.

Figure 25:
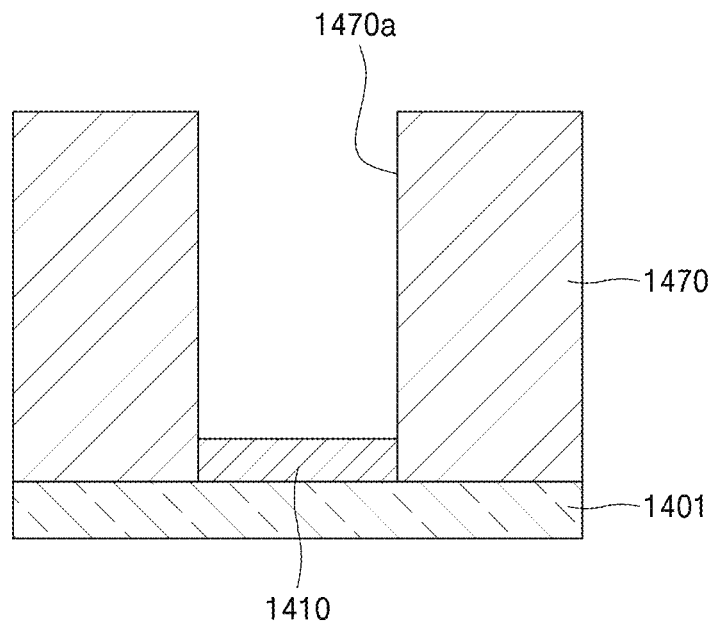
FIGS. 25 to 28 are cross-sectional views showing a method of manufacturing a switching device, according to some example embodiments.

Referring to FIG. 25, a dielectric layer 1470 is formed on a substrate 1401, and then a trench 1470*a* is formed to a certain depth in the dielectric layer 1470. FIG. 25 illustrates an example case in which the trench 1470*a* is formed to a depth to expose an upper surface of the substrate 1401. Next, a first electrode 1410 is deposited on the bottom of the trench 1470*a*.

Figure 26:
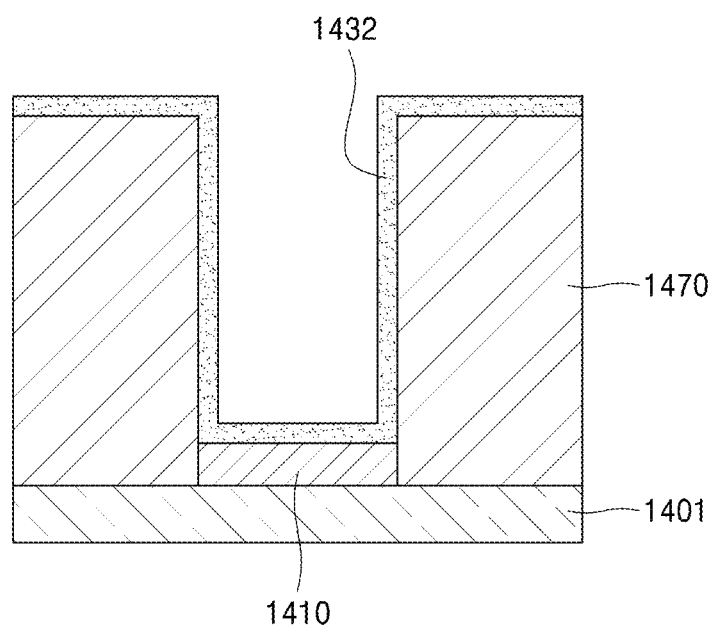
Figure 27:
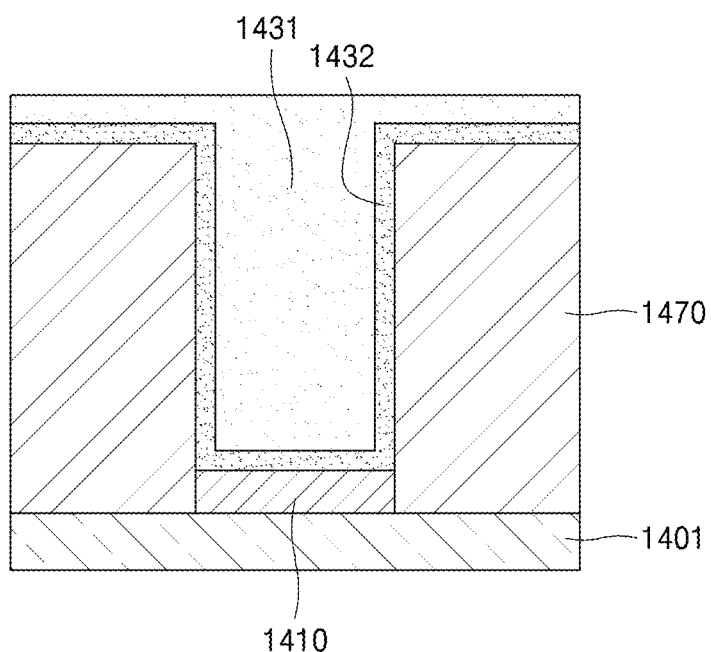

Referring to FIG. 26, a shell portion 1432 is deposited and/or grown on an inner wall of the trench 1470*a*. The shell portion 1432 may include a chalcogenide-based material. Referring to FIG. 27, a core portion 1431 is deposited on an inner side of the shell portion 1432 to fill the inside of the trench 1470*a*. The core portion 1431 may include a chalcogenide-based material like the shell portion 1432. The core portion 1431 may include a material having a lower electrical resistance than the shell portion 1432. The core portion 1431 may include a different material from the shell portion 1432 or may have a different material composition from the shell portion 1432.

Figure 28:
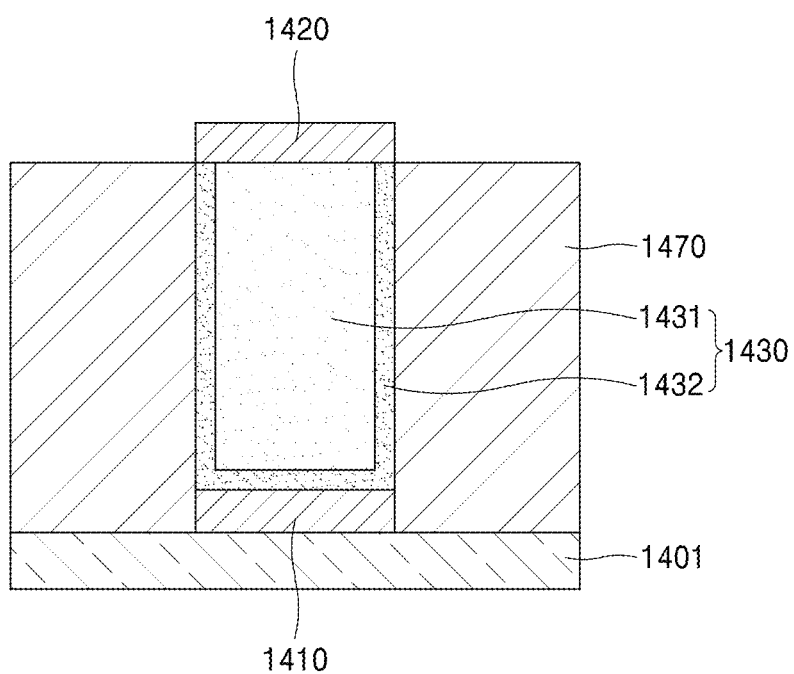

Referring to FIG. 28, by performing a planarization process (for example with a chemical mechanical planarization process and/or an etch-back process) on the core portion 1431 and the shell portion 1432, a switching material layer 1430 having a core-shell structure is formed. Next, a switching device is completed by depositing a second electrode 1420 on an upper surface of the switching material layer 1430. Then, the substrate 1401 and the dielectric layer 1470 may be removed or left.

Although in the above description a case in which the shell portion 1432 covers the side surface and the lower surface of the core portion 1431 is described, the shell portion 1432 may be formed to additionally form the upper surface of the core portion 1431. Furthermore, an interface layer (not shown) forming a junction barrier with the core portion 1431 may be additionally formed on the upper surface of the core portion 1431. A plurality of core portions (not shown) and a plurality of shell portions (not shown) may be formed in the inside of the trench 1470*a*.

Figure 29:
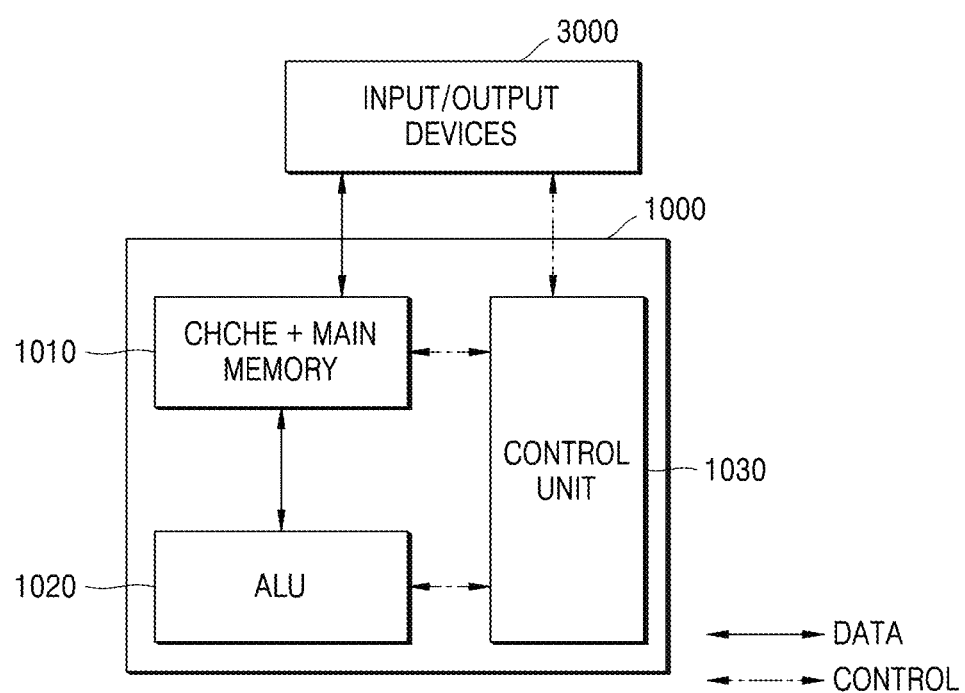
FIGS. 29 and 30 are conceptual views schematically showing an electronic device architecture applicable to an electronic apparatus, according to some example embodiments.
Figure 30:
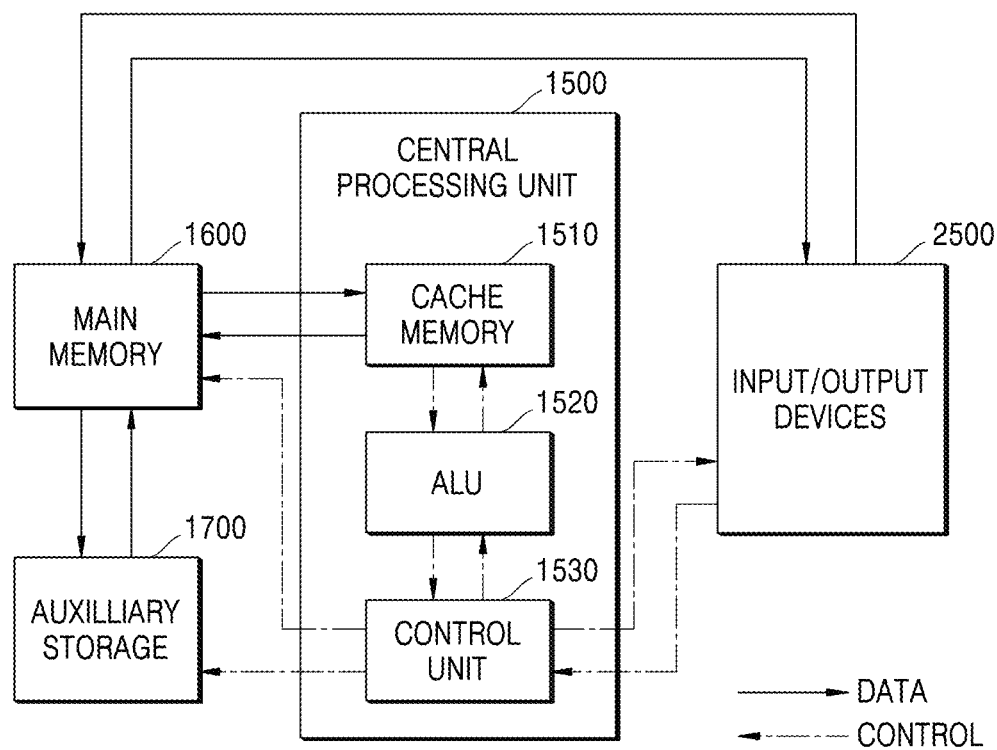

FIGS. 29 and 30 are conceptual views schematically showing an electronic device architecture applicable to an electronic apparatus, according to some example embodiments.

Referring to FIG. 29, an electronic device architecture 1000 may include a memory unit 1010, an arithmetic logic unit (ALU) 1020, and a control unit 1030. The memory unit 1010, the ALU 1020, and the control unit 1030 may be electrically connected. For example, the electronic device architecture 1000 may be prepared as one chip including the memory unit 1010, the ALU 1020, and the control unit 1030. In particular, the memory unit 1010, the ALU 1020, and the control unit 1030 may be interconnected by metal lines in an on-chip and directly communicate with one another. The memory unit 1010, the ALU 1020, and the control unit 1030 may be integrated monolithically on one substrate to prepare one chip. Input/output devices 3000 may be connected to the electronic device architecture (chip) 1000.

The memory unit 1010, the ALU 1020, and the control unit 1030 may each independently include a two-terminal device and/or a memory cell such as those described above, and may include other active and/or passive components. For example, the memory unit 1010 may include the memory the memory cells described above. The memory unit 1010 may include both a main memory and a cache memory. The electronic device architecture (chip) may be an on-chip memory processing unit.

Referring to FIG. 30, a cache memory 1510, an ALU 1520, and a control unit 1530 may constitute a central processing unit (CPU) 1500. Any or all of cache memory 1510, a main memory 1600, and an auxiliary storage 1700 may be prepared, and may include features described above.

In some cases, the electronic device architecture may be implemented as in which computing unit devices and memory unit devices are adjacent to each other in one chip without any distinction between sub-units.

According to some example embodiments, as the switching device is formed to have a core-shell structure and the shell portion is formed to have an electrical resistance greater than an electrical resistance of the core portion, most current may flow through the core portion, and a leakage current flowing in the sidewall of the switching device may be reduced. Accordingly, a memory device having a three-dimensional cross point array structure capable of low power driving by securing a low off current characteristic may be implemented. In the above, although embodiments have been described, these are merely example, and those of ordinary skill in the art to which the present disclosure pertains could make various modifications and changes from these descriptions.

It should be understood that embodiments described herein should be considered in a descriptive sense only and not for purposes of limitation. Descriptions of features or aspects within various example embodiments should typically be considered as available for other similar features or aspects in other example embodiments. Example embodiments are not necessarily mutually exclusive with one another. For example, some example embodiments may include features described with reference to one or more figures, and may also include features described with reference to one or more other figures. While one or more example embodiments have been described with reference to the figures, it will be understood by those of ordinary skill in the art that various changes in form and details may be made therein without departing from the spirit and scope as defined by the following claims.

What is claimed is:

1. A switching device comprising:
first and second electrodes vertically apart from each other;
wherein the first electrode is a top electrode and the second electrode is a bottom electrode; and
a switching material layer between the first and second electrodes,
wherein the switching material layer comprises a core portion and a shell portion, the shell portion covering a side surface of the core portion and comprising a material having an electrical resistance greater than an electrical resistance of the core portion, the core portion comprising a body having a shape of a filled-in cylinder, wherein
the filled-in cylindrical body of the core portion includes a chalcogenide, and
the shell portion includes a chalcogenide, and
wherein in a cross-sectional view, the shell portion further covers a lower surface of the core portion with respect to the first and second electrode.

2. The switching device of claim 1,
wherein the switching material layer comprises a chalcogen element and at least one of Ge, As, or Sb.

3. The switching device of claim 2,
wherein the chalcogen element comprises at least one of Se or Te.

4. The switching device of claim 2,
wherein the switching material layer further comprises a dopant.

5. The switching device of claim 4,
wherein the dopant comprises at least one of In, Al, C, B, Sr, Ga, O, N, Si, Ga, or P.

6. The switching device of claim 1,
wherein at least one of the core portion and the shell portion have different material compositions or comprise different materials.

7. A switching device comprising:
first and second electrodes vertically apart from each other;

wherein the first electrode is a top electrode and the second electrode is a bottom electrode; and
a switching material layer between the first and second electrodes,
wherein the switching material layer comprises a core portion and a shell portion, the shell portion covering a side surface of the core portion and comprising a material having an electrical resistance greater than an electrical resistance of the core portion, the core portion comprising a body having a shape of a filled-in cylinder, wherein
the filled-in cylindrical body of the core portion includes a chalcogenide, and
the shell portion includes a chalcogenide, and
wherein in a cross-sectional view, the shell portion covers an upper surface of the core portion with respect to the first and second electrode.

8. The switching device of claim 1,
wherein the switching material layer further comprises an interface layer on an upper surface of the core portion and having at least one of one of a p-n junction with the core portion or a Schottky junction with the core portion.

9. The switching device of claim 1,
wherein the core portion comprises a plurality of core portions and the shell portion comprises a plurality of shell portions.

10. The switching device of claim 1,
wherein the core portion comprises a material having an energy bandgap less than an energy bandgap of the shell portion.

11. The switching device of claim 1,
wherein the core portion comprises a material having a trap concentration greater than a trap concentration of the shell portion.

12. The switching device of claim 1,
wherein a cross-sectional size of the core portion is 50% or more of a cross-sectional size of the switching material layer.

13. A two-terminal device comprising:
a first terminal which is a top terminal,
a second terminal which is a bottom terminal,
a switching material layer between the first terminal and the second terminal, wherein the switching material layer comprises a core portion and a shielding portion, the shielding portion coaxial with a filled-in cylindrical body of the core portion and comprising a material having an electrical resistance greater than an electrical resistance of the core portion,
the filled-in cylindrical body of the core portion comprises a chalcogenide,
the shielding portion comprises a chalcogenide, and
in a cross-sectional view, the shielding portion surrounds a bottom surface of the core portion with respect to the first and second terminals.

14. The two-terminal device of claim 13, wherein the shielding portion surrounds a sidewall of the core portion.

15. The two-terminal device of claim 13, wherein at least one of the two terminals directly contact at least one of the shielding portion and the core portion.

16. A memory cell comprising:
the two-terminal device of claim 13, and
a memory material layer directly connected to one of the two terminals of the two-terminal device.

17. The memory cell of claim 16, further comprising:
a third terminal connected to the memory material layer.

18. An electronic device comprising:
the memory cell of claim 17; and
at least one active or passive device.

19. The switching device of claim 1, wherein the shell portion surrounds a bottom of the core portion.

20. The switching device of claim 1, wherein both the shell portion and the core portion include Ge, As, Se, and a dopant.

21. The switching device of claim 20, wherein the dopants included in the shell portion and the core portion include at least one of In, Al, C, B, Sr, Ga, O, N, Si, Ga, or P.

22. The switching device of claim 1, wherein the shell portion contacts a bottom surface of the second electrode.

23. The switching device of claim 22, wherein the shell portion directly contacts the bottom surface of the second electrode.

24. The switching device of claim 1, wherein
the core portion includes a first core portion and a second core portion,
the shell portion includes a first shell portion and a second shell portion, and
the second core portion is between the first shell portion and the second shell portion.

25. The switching device of claim 24, wherein a bottom surface of the second shell portion contacts a top surface of the second electrode.

26. The switching device of claim 25, wherein the bottom surface of the second shell portion directly contacts the top surface of the second electrode.

27. The two-terminal device of claim 13, wherein both the shielding portion and the core portion include Ge, As, Se, and a dopant.

28. The two-terminal device of claim 27, wherein the dopants included in the shielding portion and the core portion include at least one of In, Al, C, B, Sr, Ga, O, N, Si, Ga, or P.

29. The two-terminal device of claim 13, wherein the shielding portion contacts a bottom surface of one of the two terminals.

* * * * *